(12) United States Patent
Vellianitis

(10) Patent No.: US 11,335,811 B2
(45) Date of Patent: May 17, 2022

(54) SEMICONDUCTOR ARRANGEMENT COMPRISING BUFFER LAYER AND SEMICONDUCTOR COLUMNS OVER THE BUFFER LAYER AND FORMATION THEREOF

(71) Applicant: Taiwan Semiconductor Manufacturing Company Limited, Hsin-Chu (TW)

(72) Inventor: Georgios Vellianitis, Heverlee (BE)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 15/342,380

(22) Filed: Nov. 3, 2016

(65) Prior Publication Data
US 2017/0084752 A1 Mar. 23, 2017

Related U.S. Application Data

(62) Division of application No. 14/318,753, filed on Jun. 30, 2014, now Pat. No. 9,490,331.

(51) Int. Cl.
*H01L 29/786* (2006.01)
*H01L 29/66* (2006.01)
(Continued)

(52) U.S. Cl.
CPC ............ *H01L 29/78618* (2013.01); *H01L 21/823807* (2013.01); *H01L 21/823814* (2013.01);
(Continued)

(58) Field of Classification Search
CPC ............ H01L 29/78618; H01L 27/092; H01L 29/78642; H01L 29/42392; H01L 29/78696; H01L 21/823885; H01L 21/823807; H01L 21/823814; H01L 21/823828; H01L 29/66356; H01L 29/7788; H01L 29/7391; H01L 29/66666; H01L 29/41741; H01L 21/823487; H01L 27/2454; H01L 29/7827–7828;
(Continued)

(56) References Cited

U.S. PATENT DOCUMENTS 9,400,862 B2 * 7/2016 Kawa ................. G06F 17/5072
2005/0280156 A1 * 12/2005 Lee ......................... H01L 23/48
257/758
(Continued)

*Primary Examiner* — Nelson Garces
(74) *Attorney, Agent, or Firm* — Cooper Legal Group LLC

(57) ABSTRACT

A semiconductor arrangement and methods of formation are provided. A semiconductor arrangement includes a semiconductor column on a buffer layer over a substrate. The buffer layer comprises a conductive material. Both a first end of the semiconductor column and a bottom contact are connected to a buffer layer such that the first end of the semiconductor column and the bottom contact are connected to one another through the buffer layer, which reduces a contact resistance between the semiconductor column and the bottom contact. A second end of the semiconductor column is connected to a top contact. In some embodiments, the first end of the semiconductor column corresponds to a source or drain of a transistor and the second end corresponds to the drain or source of the transistor.

20 Claims, 12 Drawing Sheets

(51) Int. Cl.
*H01L 29/423* (2006.01)
*H01L 29/417* (2006.01)
*H01L 29/778* (2006.01)
*H01L 29/739* (2006.01)
*H01L 21/8238* (2006.01)
*H01L 27/092* (2006.01)
*H01L 21/8234* (2006.01)

(52) U.S. Cl.
CPC ........... *H01L 21/823828* (2013.01); *H01L 21/823885* (2013.01); *H01L 27/092* (2013.01); *H01L 29/41741* (2013.01); *H01L 29/42392* (2013.01); *H01L 29/66356* (2013.01); *H01L 29/66666* (2013.01); *H01L 29/7391* (2013.01); *H01L 29/7788* (2013.01); *H01L 29/78642* (2013.01); *H01L 29/78696* (2013.01); *H01L 21/823487* (2013.01)

(58) Field of Classification Search
CPC ........ H01L 29/0676; H01L 21/02603; H01L 29/775; H01L 29/66469; H01L 29/66439; H01L 29/66462; H01L 29/78681

USPC .............................. 257/324–334
See application file for complete search history.

(56) References Cited

U.S. PATENT DOCUMENTS

| | | | |
|---|---|---|---|
| 2009/0161441 A1* | 6/2009 | Masuoka | G11C 16/0416 365/185.29 |
| 2010/0052055 A1* | 3/2010 | Takeuchi | H01L 27/092 257/351 |
| 2010/0295136 A1* | 11/2010 | Or-Bach | H01L 21/76254 257/390 |
| 2011/0115011 A1* | 5/2011 | Masuoka | H01L 21/823431 257/314 |
| 2012/0299088 A1* | 11/2012 | Heineck | H01L 27/10802 257/329 |
| 2015/0370951 A1* | 12/2015 | Kawa | G06F 30/392 716/119 |
| 2016/0005764 A1* | 1/2016 | Masuoka | H01L 27/092 257/329 |
| 2016/0056173 A1* | 2/2016 | Masuoka | H01L 29/66666 257/203 |

* cited by examiner

SEMICONDUCTOR ARRANGEMENT COMPRISING BUFFER LAYER AND SEMICONDUCTOR COLUMNS OVER THE BUFFER LAYER AND FORMATION THEREOF

RELATED APPLICATION

This application is a divisional of and claims priority to U.S. patent application Ser. No. 14/318,753, titled "FORMATION OF SEMICONDUCTOR ARRANGEMENT COMPRISING BUFFER LAYER AND SEMICONDUCTOR COLUMN OVERLYING BUFFER LAYER" (As amended) and filed on Jun. 30, 2014, which is incorporated herein by reference.

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
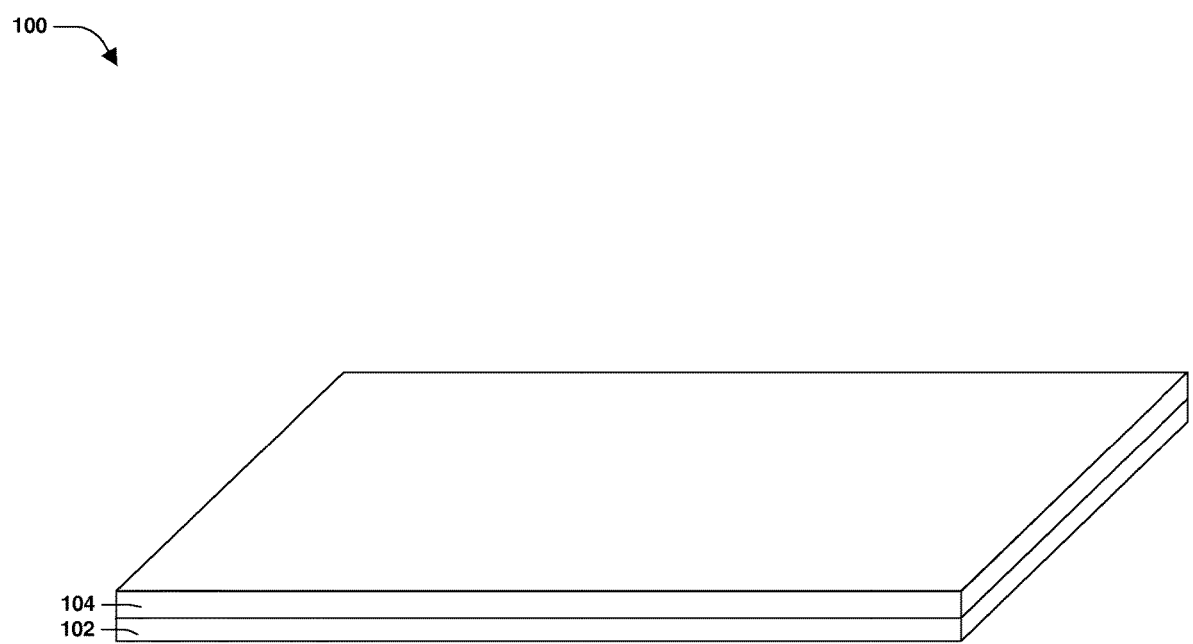
FIG. 1 is an illustration of a perspective view of a semiconductor arrangement at a stage of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein. Some embodiments of the present disclosure have one or a combination of the following features and/or advantages.

According to some embodiments, a semiconductor arrangement comprises a buffer layer over a portion of a substrate. In some embodiments, the buffer layer is disposed within a recess formed within the substrate. In some embodiments, the buffer layer comprises a conductive material. In some embodiments, a first semiconductor column is on the buffer layer. In some embodiments, a first end of the first semiconductor column is connected to the buffer layer. In some embodiments, the first semiconductor column comprises at least one of a source or a drain. In some embodiments, a first gate is formed around a channel of the first semiconductor column. In some embodiments, a top contact is connected to a second end of the first semiconductor column. In some embodiments, a bottom contact is connected to the buffer layer. In some embodiments, the bottom contact is connected to the first end of the first semiconductor column through the buffer layer.

According to some embodiments, a method of forming the semiconductor arrangement comprises at least one of forming the buffer layer over the substrate or forming the buffer layer in the recess within the substrate. In some embodiments, a first dielectric layer is formed over the buffer layer. In some embodiments, a first opening is formed in the first dielectric layer. In some embodiments, the first opening exposes a first portion of the buffer layer. In some embodiments, the first semiconductor column is formed in the first opening. In some embodiments, the top contact is formed such that the top contact is connected to the second end of the first semiconductor column. In some embodiments, the bottom contact is formed such that the bottom contact is connected to the first end of the first semiconductor column through the buffer layer.

In some embodiments, establishing a connection between the first semiconductor column and the bottom contact through the buffer layer reduces a contact resistance between the first semiconductor column and the bottom contact, as compared to not connecting the first semiconductor column to the bottom contact through the buffer layer, such as where the first semiconductor column and the bottom contact are connected to one another through the substrate. In some embodiments, the bottom contact is closer to the first semiconductor column when the bottom contact is connected to the first semiconductor column through the buffer layer as compared to where the bottom contact is not connected to the first semiconductor column through the buffer layer, such as where the first semiconductor column and the bottom contact are connected to one another through the substrate. In some embodiments, a band offset difference between a valence bond offset and a conduction bond offset of an interface between the first semiconductor column and the buffer layer is less than a band offset difference between a valence bond offset and a conduction bond offset of an interface between the first semiconductor column and the substrate. In some embodiments, an interface with a lower band offset difference has a lower contact resistance.

FIGS. 1-6, 9, 10, and 13 are perspective views of a semiconductor arrangement 100, and FIGS. 7, 8, 11, and 12, are cross-sectional views of the semiconductor arrangement 100, according to some embodiments, at various stages of fabrication. Turning to FIG. 1, a layer of buffer material 104 is formed over a substrate 102, according to some embodiments. In some embodiments, the substrate 102 includes at least one of an epitaxial layer, a silicon-on-insulator (SOI) structure, a wafer, or a die formed from a wafer. In some embodiments, the substrate 102 comprises at least one of silicon, carbon, etc. In some embodiments, the layer of buffer material 104 is formed by at least one of growth or deposition. In some embodiments, the layer of buffer material 104 is formed by at least one of physical vapor deposition (PVD), chemical vapor deposition (CVD), or atomic layer deposition (ALD). In some embodiments, the layer of buffer material 104 comprises at least one of germanium, silicon, a group III element, a group V element, etc. In some embodiments, the layer of buffer material 104 has a buffer layer thickness between about 5 nm to about 1000 nm.

Figure 2:
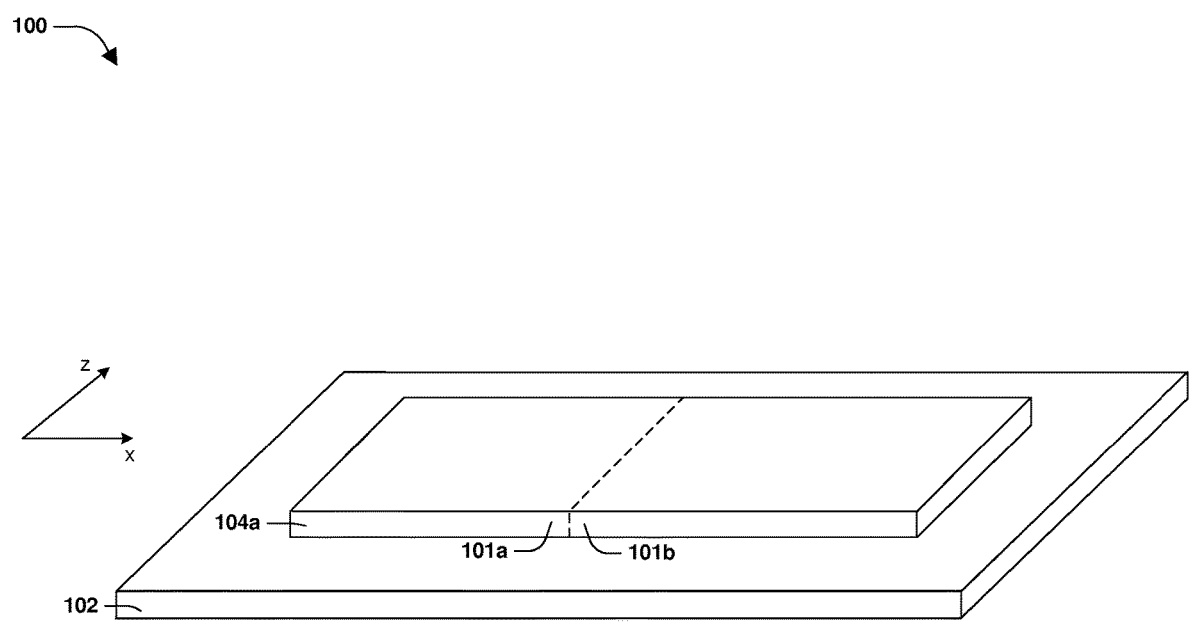
FIG. 2 is an illustration of a perspective view of a semiconductor arrangement at a stage of fabrication, in accordance with some embodiments.

Turning to FIG. 2, the layer of buffer material 104 is patterned to form a buffer layer 104a, according to some embodiments. In some embodiments, the layer of buffer material 104 is patterned by etching. In some embodiments, the layer of buffer material 104 is patterned using a first mask. In some embodiments, the buffer layer 104a exposes at least some of the substrate 102. In some embodiments, the buffer layer 104a has a buffer layer width measured in the z direction or into and out of the page. In some embodiments, the buffer layer width is between about 5 nm to about 100 nm. In some embodiments, the buffer layer 104a has a buffer layer length measured in the x direction or from left to right on the page. In some embodiments, the buffer layer length is between about 5 nm to about 1000 nm. In some embodiments, the buffer layer 104a comprises a first portion 101a and a second portion 101b.

Figure 3:
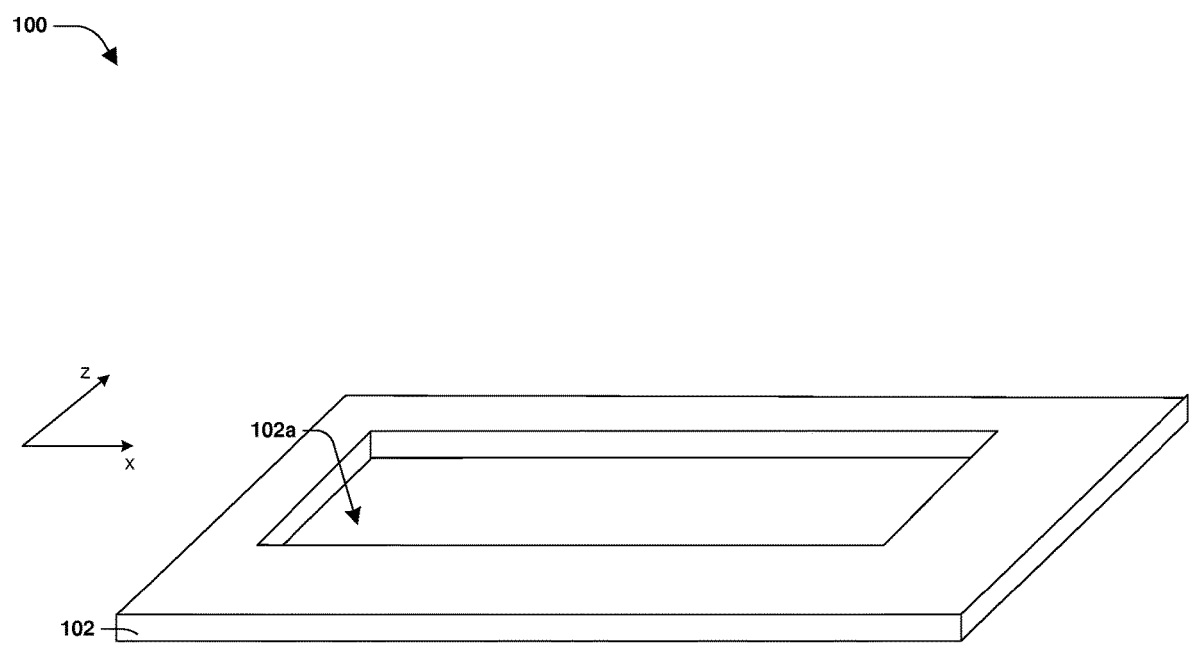
FIG. 3 is an illustration of a perspective view of a semiconductor arrangement at a stage of fabrication, in accordance with some embodiments.

Turning to FIG. 3, prior to forming the layer of buffer material 104, the substrate 102 is recessed, to form a recess 102a, according to some embodiments. In some embodiments, the recess 102a is formed by etching. In some embodiments, the recess 102a has a recess depth between about 5 nm to about 1000 nm. In some embodiments, the recess 102a has a recess width measured in the z direction or into and out of the page. In some embodiments, the recess width is between about 5 nm to about 100 nm. In some embodiments, the recess 102a has a recess length measured in the x direction or from left to right on the page. In some embodiments, the recess length is between about 5 nm to about 1000 nm.

Figure 4:
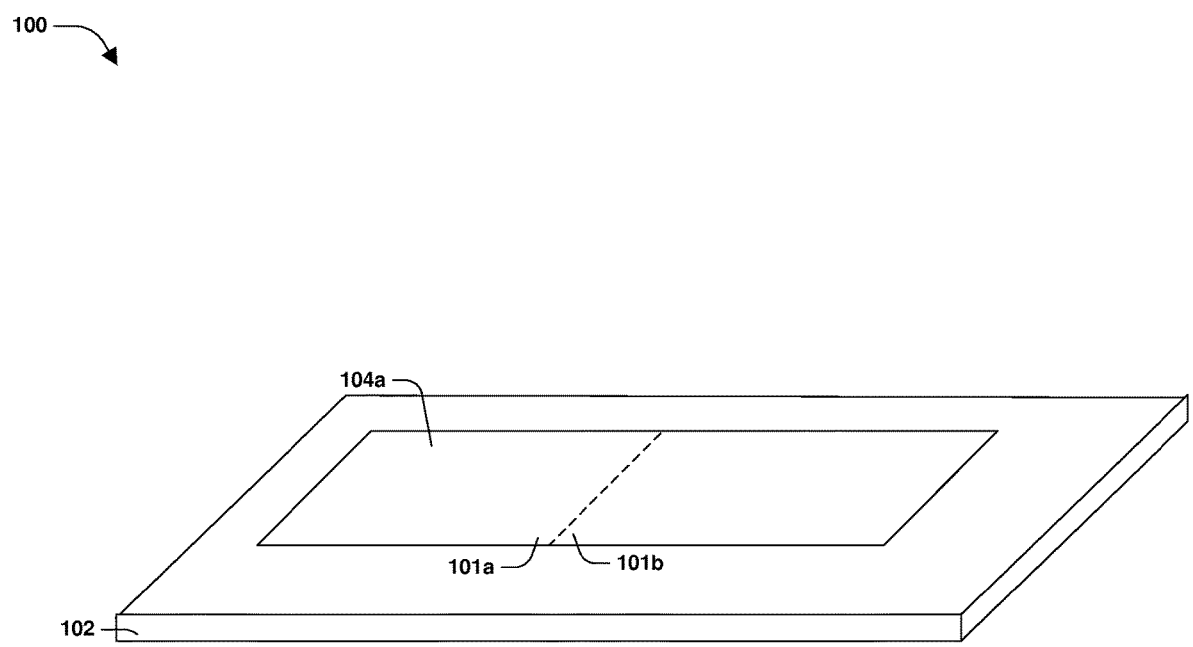
FIG. 4 is an illustration of a perspective view of a semiconductor arrangement at a stage of fabrication, in accordance with some embodiments.

Turning to FIG. 4, the buffer layer 104a is formed in the recess 102a, according to some embodiments. In some embodiments, the layer of buffer material 104 is formed over the substrate 102 and in the recess 102a. In some embodiments, chemical mechanical planarization (CMP) is performed to form the buffer layer 104a in the recess 102a. In some embodiments, the CMP removes excess of the layer of buffer material 104 from a top surface of the substrate 102. In the following illustrations, for simplicity, the buffer layer 104a is not shown as being in the recess 102a. However, reference herein to the buffer layer 104a as being over the substrate 102 is also intended to include, in some instances, the buffer layer 104a being in the recess 102a, according to some embodiments. In some embodiments, because the buffer layer 104a is over at least some of the substrate 102 regardless of whether the buffer layer 104a is or is not in the recess 102a.

Figure 5:
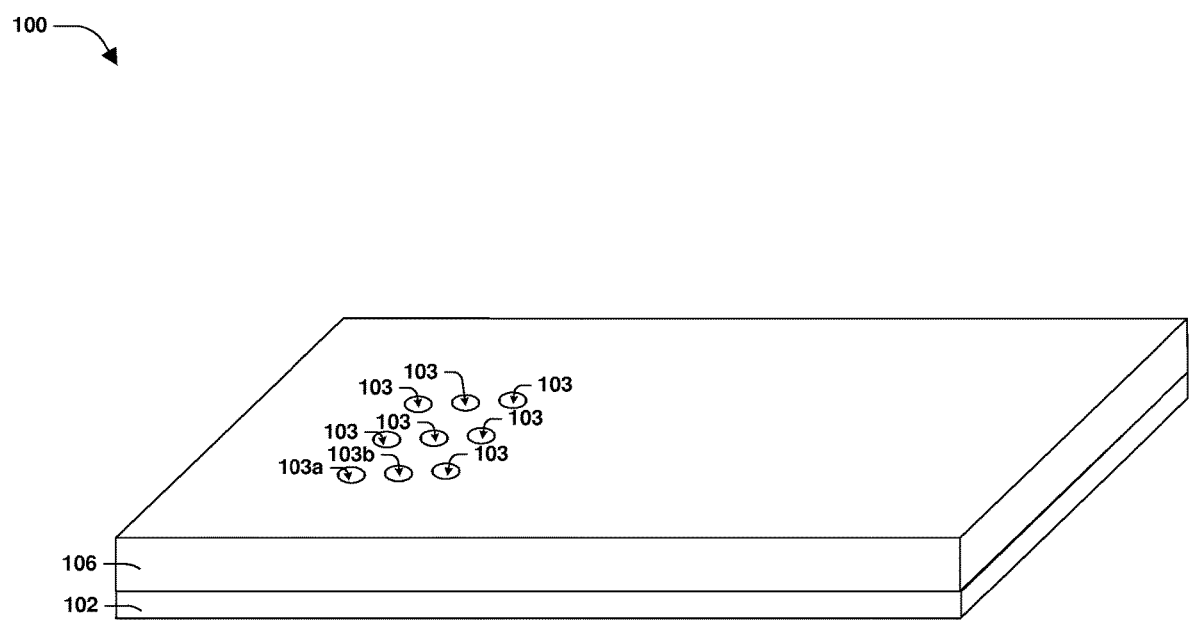
FIG. 5 is an illustration of a perspective view of a semiconductor arrangement at a stage of fabrication, in accordance with some embodiments.

Turning to FIG. 5, a first dielectric layer 106 is formed over the buffer layer 104a (not visible in FIG. 5) and the substrate 102, according to some embodiments. In some embodiments, the first dielectric layer 106 is at least one of grown or deposited. In some embodiments, the first dielectric layer 106 is formed by at least one of CVD, ALD, or PVD. In some embodiments, the first dielectric layer 106 comprises a low dielectric constant material, such as oxide. In some embodiments, a first opening 103a is formed in the first dielectric layer 106, such that at least some of the first portion 101a of the buffer layer 104a (not visible in FIG. 5) is exposed. In some embodiments, a second opening 103b is formed in the first dielectric layer 106, such that at least some of the first portion 101a of the buffer layer 104a is exposed. In some embodiments, one or more additional openings 103 are formed in the first dielectric layer 106, such that at least some of the first portion 101a of the buffer layer 104a is exposed. In some embodiments, at least one of the first opening 103a, the second opening 103b, or the one or more additional openings 103 are formed by etching.

Figure 6:
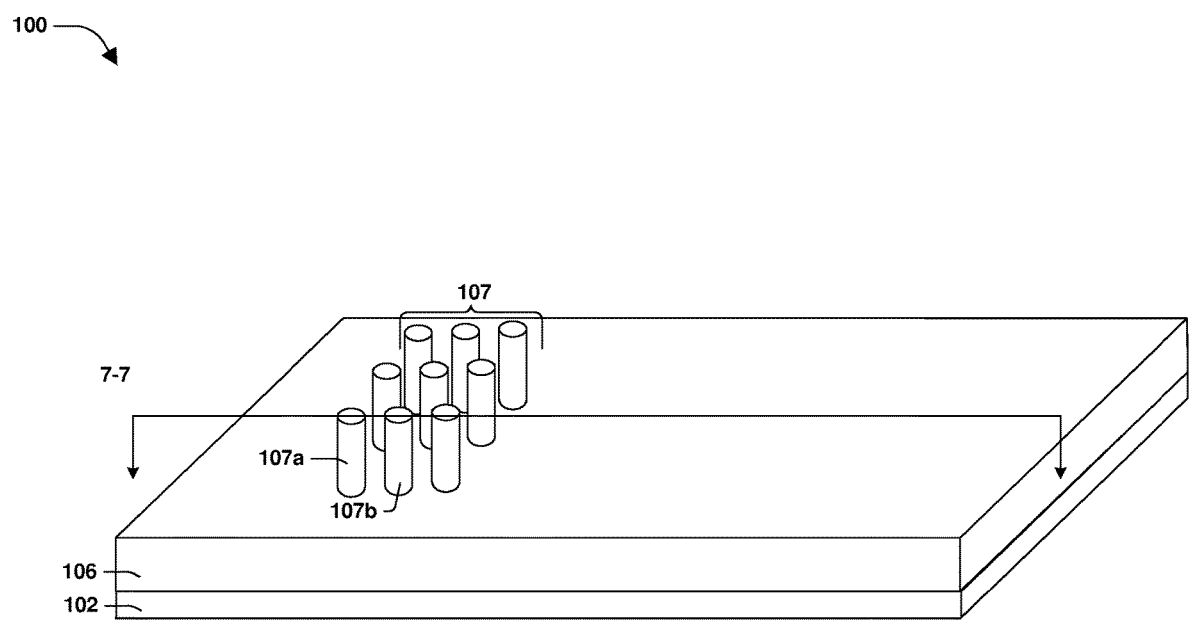
FIG. 6 is an illustration of a perspective view of a semiconductor arrangement at a stage of fabrication, in accordance with some embodiments.
Figure 14:
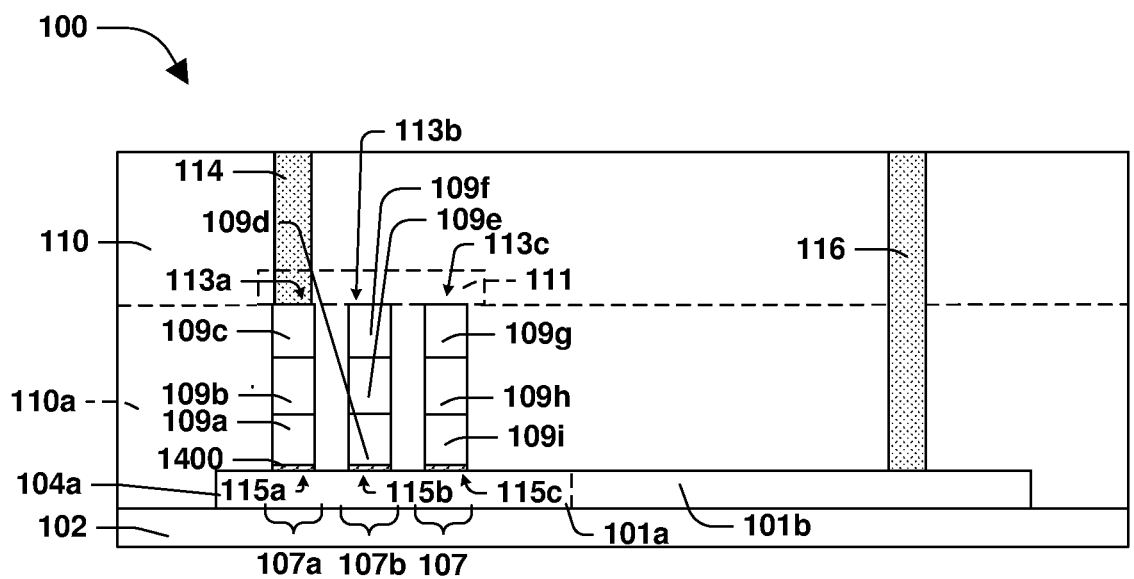
FIG. 14 is an illustration of a cross sectional view of a semiconductor arrangement at a stage of fabrication, in accordance with some embodiments.

Turning to FIG. 6, at least one of a first semiconductor column 107a is formed in the first opening 103a, a second semiconductor column 107b is formed in the second opening 103b, or one or more additional semiconductor columns 107 are formed in the one or more additional openings 103, according to some embodiments. In some embodiments, at least one of the first semiconductor column 107a, the second semiconductor column 107b, or the one or more additional semiconductor columns 107 are formed by at least one of growth or deposition. In some embodiments, at least one of the first semiconductor column 107a, the second semiconductor column 107b, or the one or more additional semiconductor columns 107 are formed by at least one of PVD, CVD, or ALD. In some embodiments, at least one of the first semiconductor column 107a, the second semiconductor column 107b, or the one or more additional semiconductor columns 107 comprise at least one of germanium, silicon, a group III element, a group V element, etc. In some embodiments, as illustrated in FIG. 14, a silicide layer 1400 is formed between at least one of the first semiconductor column 107a, the second semiconductor column 107b, or the one or more additional semiconductor columns 107 and the buffer layer 104a (not visible in FIG. 6 or 14). In some embodiments, a doped region is formed between at least one of the first semiconductor column 107a, the second semiconductor column 107b, or the one or more additional semiconductor columns 107 and the buffer layer 104a.

Figure 7:
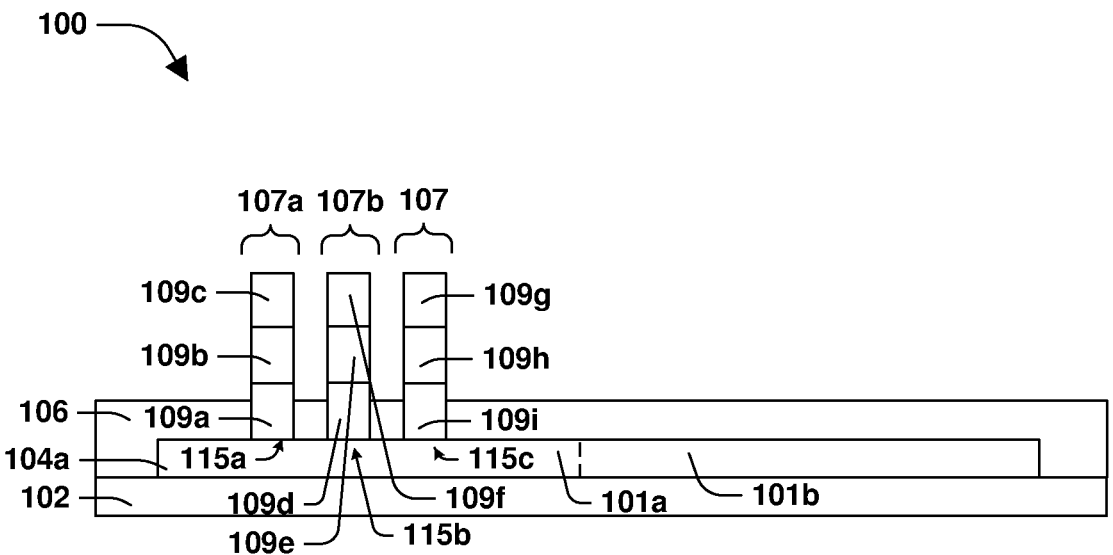
FIG. 7 is an illustration of a cross sectional view of a semiconductor arrangement at a stage of fabrication, in accordance with some embodiments.

Turning to FIG. 7, a cross-sectional view of the semiconductor arrangement 100 taken along line 7-7 of FIG. 6 is illustrated, according to some embodiments. In some embodiments, the first semiconductor column 107a comprises a first region 109a, a second region 109b, and a third region 109c. In some embodiments, the first semiconductor column 107a has a first end 115a in contact with the buffer layer 104a. In some embodiments, at least one of the first region 109a, the second region 109b or the third region 109c is grown. In some embodiments, the first region 109a comprises at least one of a first conductivity type or a second conductivity type. In some embodiments, the third region 109c comprises at least of the first conductivity type or the second conductivity type. In some embodiments, the first conductivity type is at least one of n-type or p-type. In some embodiments, the second conductivity type comprises n-type when the first conductivity type comprises p-type and the second conductivity type comprises p-type when the first conductivity type comprises n-type.

In some embodiments, the first region 109a comprises at least one of a source or a drain. In some embodiments, the third region 109c comprises a source when the first region 109a comprises a drain. In some embodiments, the third region 109c comprises a drain when the first region 109a comprises a source. In some embodiments, the second region 109b comprises a channel. In some embodiments, the second region 109b is absent, such that the first region 109a abuts the third region 109c (not shown), where the first region 109a comprises the first conductivity type and the third region 109c comprises the second conductivity type. In some embodiments, the second semiconductor column 107b comprises a fourth region 109d, a fifth region 109e and a sixth region 109f, according to some embodiments. In some embodiments, the second semiconductor column 107b has a first end 115b in contact with the buffer layer 104a. In some embodiments, the second semiconductor column 107b is formed in substantially the same manner and has substantially the same arrangement as described above with regard to the first semiconductor column 107a. In some embodiments, the one or more additional semiconductor columns 107 comprise one or more additional seventh regions 109g, one or more additional eighth regions 109h and one or more additional ninth regions 109i, according to some embodiments. In some embodiments, the one or more additional semiconductor columns 107 have one or more additional first ends 115c in contact with the buffer layer 104a. In some embodiments, the one or more additional semiconductor columns 107 are formed in substantially the same manner and have substantially the same arrangement as described above with regard to the first semiconductor column 107a.

Figure 8:
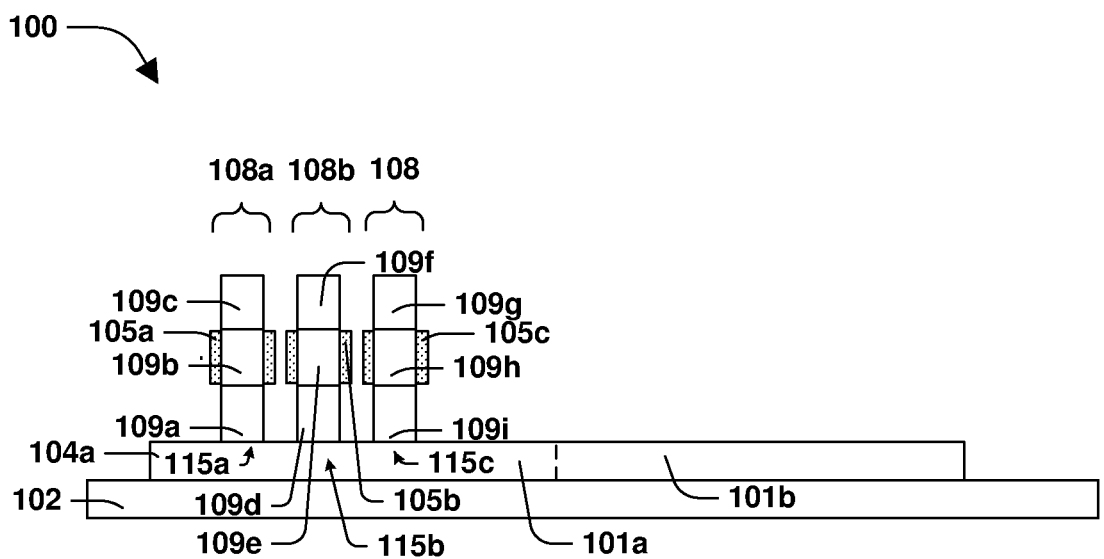
FIG. 8 is an illustration of a cross sectional view of a semiconductor arrangement at a stage of fabrication, in accordance with some embodiments.

Turning to FIG. 8, the first dielectric layer 106 is removed and at least one of a first gate 105a is formed around at least some of the second region 109b of the first semiconductor column 107a to form a first transistor 108a, a second gate 105b is formed around at least some of the fifth region 109e of the second semiconductor column 107b to form a second transistor 108b, or one or more additional gates 105c are formed around at least some of the one or more additional eighth regions 109h to form one or more additional transistors 108, according to some embodiments. In some embodiments, at least one of the first gate 105a, the second gate 105b, or the one or more additional gates 105c comprise a gate electrode surrounding a gate dielectric. In some embodiments, the gate electrode comprises a conductive material such as metal. In some embodiments, the gate dielectric comprises a low dielectric constant material, such as oxide. According to some embodiments, the first gate 105a, the second gate 105b, etc. are formed by forming at least one of a layer of gate dielectric material or a layer of gate electrode material over the first dielectric layer 106 and then performing one or more patterning operations. According to some embodiments, the first dielectric layer 106 is removed after the first gate 105a, the second gate 105b, etc. are formed. In some embodiments, gates 105a, 105b and 105c are not formed. In the following illustrations, the semiconductor columns 107a, 107b, and 107 are depicted without gates for simplicity.

Figure 9:
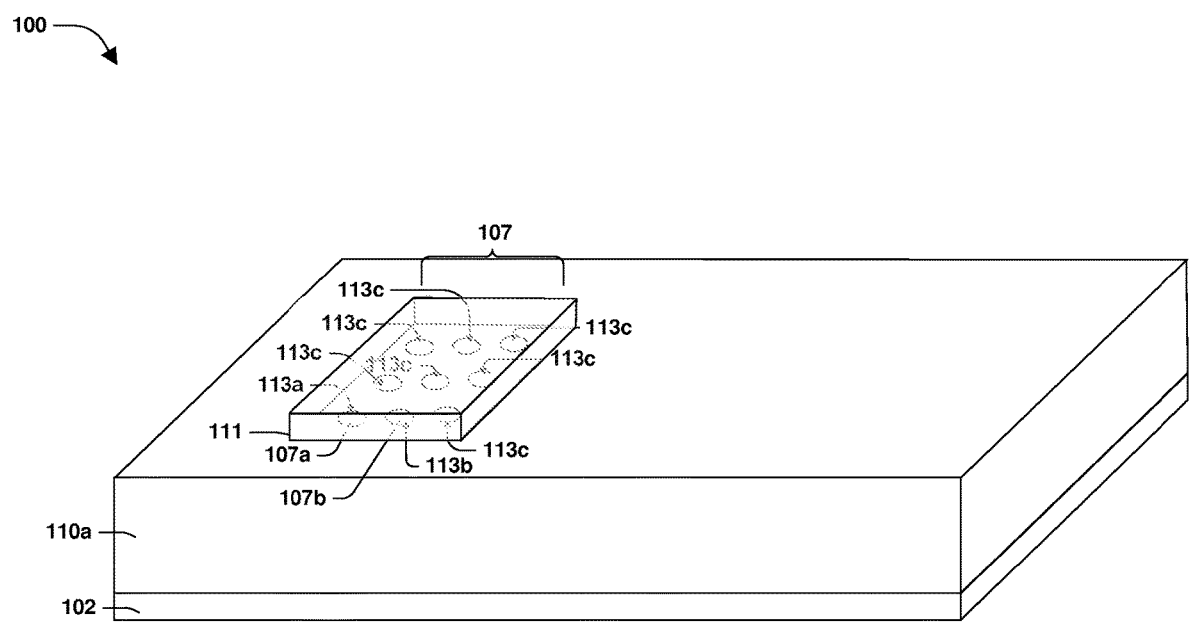
FIG. 9 is an illustration of a perspective view of a semiconductor arrangement at a stage of fabrication, in accordance with some embodiments.

Turning to FIG. 9, an intermediate dielectric layer 110a is formed over at least one of the first semiconductor column 107a, the semiconductor column 107b, the one or more additional semiconductor columns 107, the buffer layer 104a, or the substrate 102, according to some embodiments. In some embodiments, CMP is performed on the intermediate dielectric layer 110a, such that a top surface of the intermediate dielectric layer 110a is even with a top surface of at least one of a second end 113a of the first semiconductor column 107a, a second end 113b of the second semiconductor column 107b, or one or more additional second ends 113c of the one or more additional semiconductor columns 107. In some embodiments, a first metal layer 111 is formed over and in contact with at least one of the first semiconductor column 107a, the semiconductor column 107b, or the one or more additional semiconductor columns 107. In some embodiments, the first metal layer 111 is formed by at least one of growth or deposition. In some embodiments, the first metal layer 111 is patterned, such that the first metal layer 111 is in contact with desired semiconductor column(s).

Figure 10:
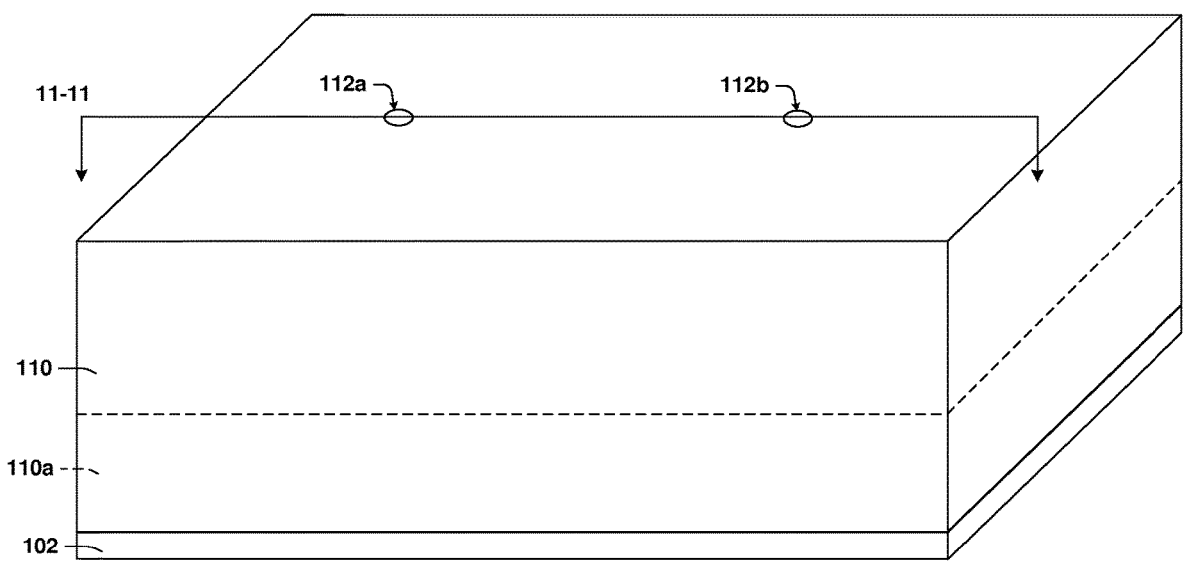
FIG. 10 is an illustration of a perspective view of a semiconductor arrangement at a stage of fabrication, in accordance with some embodiments.

Turning to FIG. 10, a second dielectric layer 110 is formed over the intermediate dielectric layer 110a, according to some embodiments. In some embodiments, such as where at least one of no first metal layer 111 is formed or no intermediate dielectric layer 110a is formed, the second dielectric layer 110 is formed over at least one of the first semiconductor column 107a, the second semiconductor column 107b, the one or more additional semiconductor columns 107, the buffer layer 104a, or the substrate 102, according to some embodiments. In some embodiments, CMP is performed on the second dielectric layer 110. In some embodiments, a top contact opening 112a is formed in the second dielectric layer 110 over at least one of the first semiconductor column 107a, the second semiconductor column 107b, or the one or more additional semiconductor columns 107. In some embodiments, a bottom contact opening 112b is formed in the second dielectric layer 110 over the second portion 101b of the buffer layer 104a (not visible in FIG. 10). In some embodiments, the top contact opening 112a is formed over the first metal layer 111 (not visible in FIG. 10).

Figure 11:
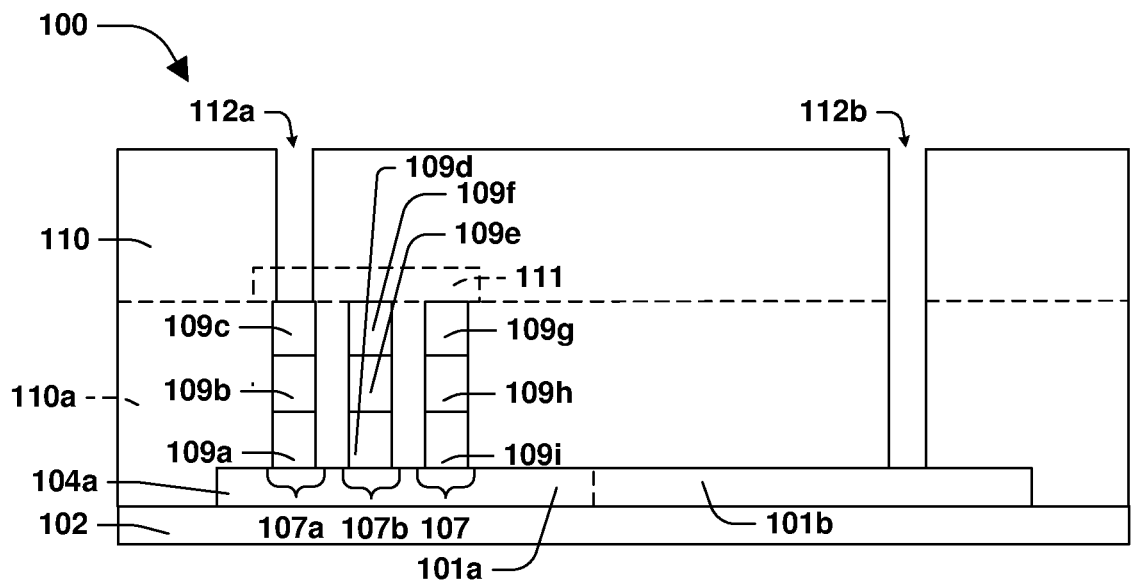
FIG. 11 is an illustration of a cross sectional view of a semiconductor arrangement at a stage of fabrication, in accordance with some embodiments.

Turning to FIG. 11, a cross-sectional view of the semiconductor arrangement 100 taken along line 11-11 of FIG. 10 is illustrated, according to some embodiments. The first metal layer 111 and the intermediate dielectric layer 110a are depicted by dashed lines in FIG. 11 to indicate that formation of at least one of the first metal layer 111 or the intermediate dielectric layer 110a is optional.

Figure 12:
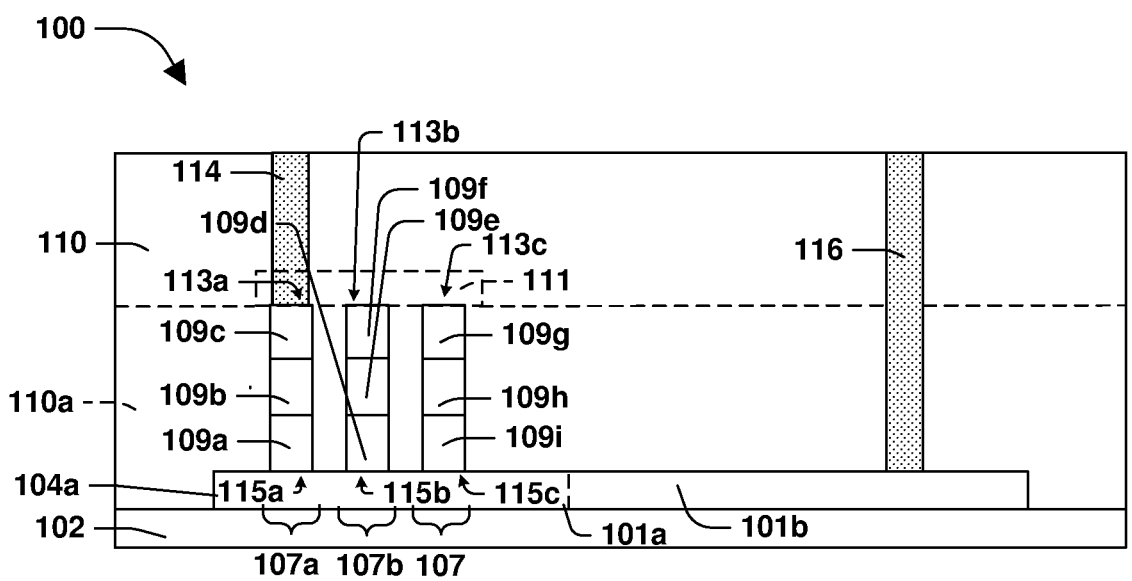
FIG. 12 is an illustration of a cross sectional view of a semiconductor arrangement at a stage of fabrication, in accordance with some embodiments.

Turning to FIG. 12, a top contact 114 is formed in the top contact opening 112a and a bottom contact 116 is formed in the bottom contact opening 112b, according to some embodiments. In some embodiments, at least one of the top contact 114 or the bottom contact 116 is formed by at least one of growth or deposition. In some embodiments, at least one of the top contact 114 or the bottom contact 116 is formed by at least one of ALD, CVD, or PVD. In some embodiments, at least one of the top contact 114 or the bottom contact 116 comprises a conductive material, such as metal. In some embodiments, the bottom contact 116 is formed such that the bottom contact 116 is connected to at least one of the first end 115a of the first semiconductor column 107a, the first end 115b of the second semiconductor column 107b, or the one or more additional first ends 115c of the one or more additional semiconductor columns 107 through the buffer material 104.

Figure 13:
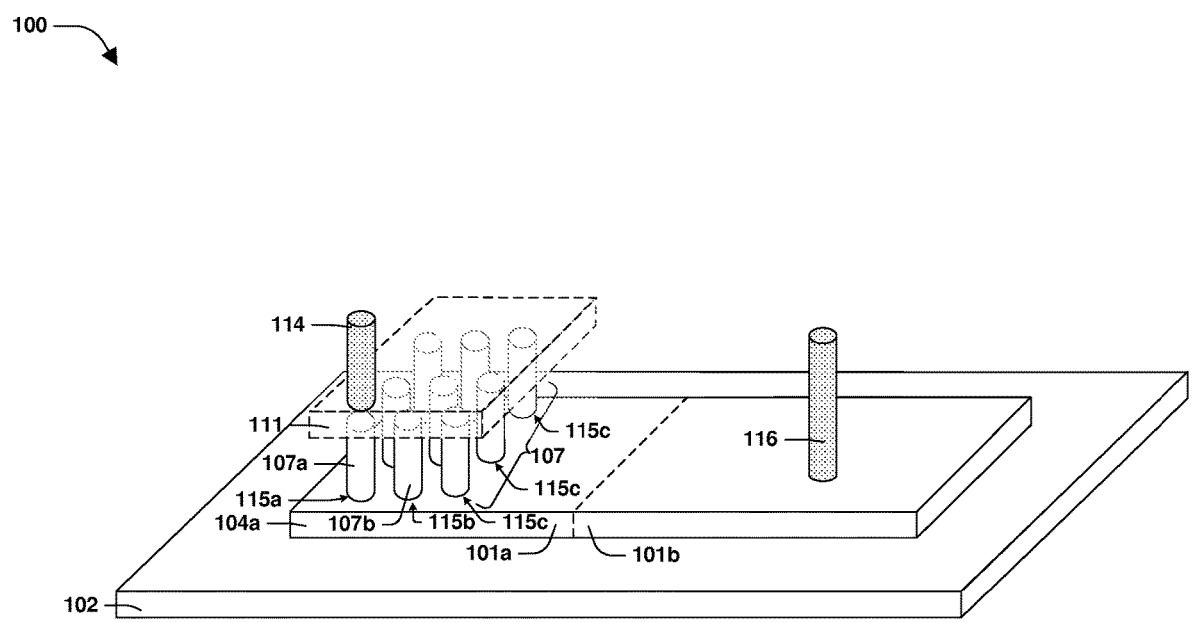
FIG. 13 is an illustration of a perspective view of a semiconductor arrangement at a stage of fabrication, in accordance with some embodiments.

Turning to FIG. 13, the second dielectric layer 110 and the intermediate dielectric layer 110a, if present, are removed, such as by etching, according to some embodiments. In some embodiments, the regions 109a-109i are not shown for ease of illustration. The first metal layer 111 is depicted by dashed lines to indicate that the first metal layer 111 is optional. In some embodiments, establishing a connection between the semiconductor columns and the bottom contact 116 through the buffer layer 104a reduces a contact resistance between the semiconductor columns and the bottom contact 116, as compared to where the semiconductor columns are not connected to the bottom contact 116 through the buffer layer 104a, such as where the semiconductor columns and the bottom contact 116 are connected to one another through the substrate 102. In some embodiments, the bottom contact 116 is closer to at least one of the semiconductor columns when the bottom contact 116 is connected to the semiconductor columns through the buffer layer 104a as compared to where the bottom contact 116 is not connected to the semiconductor columns through the buffer layer 104a, such as where the semiconductor columns and the bottom contact 116 are connected to one another through the substrate. In some embodiments, a band offset difference between a valence bond offset and a conduction bond offset of an interface between at least one of the semiconductor columns and the buffer layer 104a is less than a band offset difference between a valence bond offset and a conduction bond offset of an interface between at least one of the semiconductor columns and the substrate 102. In some embodiments, an interface with a lower band offset difference has a lower contact resistance. Although columns, openings, etc. are illustrated and/or discussed as having circular cross sections, other shapes, dimensions, etc., such as square, triangular, rectangular, oval, elliptical, etc., are contemplated and within the scope of various embodiments.

According to some embodiments, a semiconductor arrangement comprises a buffer layer over a portion of a substrate. In some embodiments, the buffer layer comprises a conductive material. In some embodiments, a first semiconductor column is on the buffer layer such that a first end of the first semiconductor column is connected to the buffer layer. In some embodiments, a top contact is connected to a second end of the first semiconductor column and a bottom contact connected to the buffer layer, such that the bottom contact is connected to the first end of the first semiconductor column.

According to some embodiments, a method of forming a semiconductor arrangement comprises forming a buffer layer over a substrate and forming a first dielectric layer over the buffer layer. According to some embodiments, the method of forming a semiconductor arrangement comprises forming a first opening in the first dielectric layer, where the first opening exposing a first portion of the buffer layer and forming a first semiconductor column in the first opening such that a first end of the first semiconductor column is connected to the buffer layer. According to some embodiments, the method of forming a semiconductor arrangement comprises forming a top contact connected to a second end of the first semiconductor column and forming a bottom contact connected to the buffer layer, such that the bottom contact is connected to the first end of the first semiconductor column.

According to some embodiments, a semiconductor arrangement comprises a buffer layer over a portion of a substrate. In some embodiments, the buffer layer comprises a conductive material. In some embodiments, a first semiconductor column is on the buffer layer. In some embodiments, a second semiconductor column is on the buffer layer. In some embodiments, a top contact is connected to at least one of the first semiconductor column or the second semiconductor column. In some embodiments, a bottom contact is connected to the buffer layer, such that the bottom contact is connected to at least one of the first semiconductor column or the second semiconductor column.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a buffer layer disposed over a substrate, the buffer layer comprising a conductive material;
   a first dielectric layer;
   a first semiconductor column in contact with an uppermost surface of the buffer layer;
   a second semiconductor column in contact with the uppermost surface of the buffer layer;
   a metal layer disposed over the first semiconductor column and the second semiconductor column and in direct contact with the first dielectric layer, wherein the metal layer is electrically coupled to the first semiconductor column and the second semiconductor column;
   a second dielectric layer overlying the metal layer and the first dielectric layer;
   a bottom contact extending through the second dielectric layer and the first dielectric layer and in direct contact with the buffer layer, wherein:
   the bottom contact is electrically coupled to the first semiconductor column and the second semiconductor column through the buffer layer,
   the bottom contact has a uniform composition from a top surface of the second dielectric layer to a bottom surface of the first dielectric layer,
   the bottom contact is spaced apart from the first semiconductor column and the second semiconductor column in a first direction, and
   in a second direction perpendicular to the first direction and parallel to a plane in which the uppermost surface of the buffer layer lies, a width of the metal layer is equal to a width of the buffer layer;
   a first gate surrounding the first semiconductor column; and
   a second gate surrounding the second semiconductor column, wherein the second gate is spaced apart from the first gate.

2. The semiconductor arrangement of claim 1, wherein:
   the first semiconductor column is in direct contact with the buffer layer, and
   an interface is present where the first semiconductor column directly contacts the buffer layer.

3. The semiconductor arrangement of claim 1, comprising:
   a silicide layer disposed over the buffer layer, wherein the first semiconductor column is separated from the buffer layer by the silicide layer.

4. The semiconductor arrangement of claim 1, wherein the first dielectric layer is in direct contact with a sidewall of the buffer layer.

5. The semiconductor arrangement of claim 1, wherein the metal layer is in direct contact with the first dielectric layer.

6. The semiconductor arrangement of claim 1, comprising:
   a top contact extending through the second dielectric layer and overlying the metal layer, wherein the top contact is electrically coupled to the first semiconductor column and the second semiconductor column through the metal layer.

7. The semiconductor arrangement of claim 1, wherein the first gate comprises:
   a gate dielectric surrounding a channel portion of the first semiconductor column; and
   a gate electrode surrounding the gate dielectric.

8. The semiconductor arrangement of claim 1, wherein:
   the first semiconductor column comprises a source portion, a drain portion, and a channel portion between the source portion and the drain portion, and
   the first dielectric layer is in direct contact with a sidewall of the source portion and a sidewall of the drain portion.

9. The semiconductor arrangement of claim 1, wherein a top surface of the first dielectric layer is co-planar with a top surface of the first semiconductor column.

10. The semiconductor arrangement of claim 1, wherein the buffer layer comprises germanium.

11. The semiconductor arrangement of claim 1, wherein the metal layer is in direct contact with the first semiconductor column.

12. A semiconductor arrangement, comprising:
    a buffer layer disposed over a substrate, the buffer layer comprising a conductive material;
    a first dielectric layer;
    a first semiconductor column over the buffer layer;
    a second semiconductor column over the buffer layer;
    a metal layer disposed over the first semiconductor column and the second semiconductor column and in direct contact with the first dielectric layer, wherein the metal layer is electrically coupled to the first semiconductor column and the second semiconductor column;
a second dielectric layer overlying the metal layer and the first dielectric layer;
a bottom contact extending through the second dielectric layer and the first dielectric layer and in direct contact with the buffer layer, wherein:
the bottom contact is electrically coupled to the first semiconductor column and the second semiconductor column through the buffer layer,
the bottom contact has a uniform composition from a top surface of the second dielectric layer to a bottom surface of the first dielectric layer,
the bottom contact is spaced apart from the first semiconductor column and the second semiconductor column in a first direction, and
in a second direction perpendicular to the first direction and parallel to a plane in which an uppermost surface of the buffer layer lies, a width of the metal layer is equal to a width of the buffer layer;
a first gate surrounding the first semiconductor column; and
a second gate surrounding the second semiconductor column, wherein the second gate is spaced apart from the first gate.

13. The semiconductor arrangement of claim 12, wherein:
the first semiconductor column is in direct contact with the buffer layer, and
an interface is present where the first semiconductor column directly contacts the buffer layer.

14. The semiconductor arrangement of claim 12, comprising:
a silicide layer disposed over the buffer layer, wherein the first semiconductor column is separated from the buffer layer by the silicide layer.

15. The semiconductor arrangement of claim 12, comprising:
a top contact extending through the second dielectric layer and overlying the metal layer, wherein the top contact is electrically coupled to the first semiconductor column and the second semiconductor column through the metal layer.

16. The semiconductor arrangement of claim 12, wherein the buffer layer comprises germanium.

17. The semiconductor arrangement of claim 12, wherein the first gate comprises:
a gate dielectric surrounding a channel portion of the first semiconductor column; and
a gate electrode surrounding the gate dielectric.

18. A semiconductor arrangement, comprising:
a buffer layer comprising a conductive material;
a first dielectric layer;
a first semiconductor column over the buffer layer;
a second semiconductor column over the buffer layer;
a metal layer disposed over the first semiconductor column and the second semiconductor column and in direct contact with the first dielectric layer, wherein the metal layer is electrically coupled to the first semiconductor column and the second semiconductor column;
a second dielectric layer overlying the metal layer and the first dielectric layer;
a bottom contact extending through the second dielectric layer and the first dielectric layer and in direct contact with the buffer layer, wherein:
the bottom contact is electrically coupled to the first semiconductor column and the second semiconductor column through the buffer layer,
the bottom contact has a uniform composition from a top surface of the second dielectric layer to a bottom surface of the first dielectric layer,
the bottom contact is spaced apart from the first semiconductor column and the second semiconductor column in a first direction, and
in a second direction perpendicular to the first direction and parallel to a plane in which an uppermost surface of the buffer layer lies, a width of the metal layer is equal to a width of the buffer layer;
a first gate surrounding the first semiconductor column; and
a second gate surrounding the second semiconductor column, wherein the second gate is spaced apart from the first gate.

19. The semiconductor arrangement of claim 18, wherein:
the first semiconductor column is in direct contact with the buffer layer, and
an interface is present where the first semiconductor column directly contacts the buffer layer.

20. The semiconductor arrangement of claim 18, comprising:
a silicide layer disposed over the buffer layer, wherein the first semiconductor column is separated from the buffer layer by the silicide layer.

* * * * *